United States Patent
Karch

(10) Patent No.: US 10,991,632 B2
(45) Date of Patent: Apr. 27, 2021

(54) ASSEMBLY PROCESS FOR CIRCUIT CARRIER AND CIRCUIT CARRIER

(71) Applicant: AB Mikroelektronik Gesellschaft mit beschraenkter Haftung, Salzburg (AT)

(72) Inventor: Andreas Karch, Uebersee (DE)

(73) Assignee: AB MIKROELEKTRONIK GESELLSCHAFT MIT BESCHRAENKTER HAFTUNG, Salzburg (AT)

( * ) Notice: Subject to any disclaimer, the term of this patent is extended or adjusted under 35 U.S.C. 154(b) by 0 days.

(21) Appl. No.: 16/889,085

(22) Filed: Jun. 1, 2020

(65) Prior Publication Data
US 2020/0294867 A1 Sep. 17, 2020

Related U.S. Application Data

(63) Continuation of application No. 16/262,260, filed on Jan. 30, 2019, now Pat. No. 10,672,672, which is a (Continued)

(30) Foreign Application Priority Data

Feb. 28, 2013 (AT) .................................. A 155/2013

(51) Int. Cl.
*H01L 21/66* (2006.01)
*H01L 23/49* (2006.01)
(Continued)

(52) U.S. Cl.
CPC .............. *H01L 22/12* (2013.01); *H01L 24/75* (2013.01); *H01L 24/83* (2013.01); *H05K 1/0269* (2013.01);
(Continued)

(58) Field of Classification Search
CPC ................... H01L 22/12; H01L 24/75; H01L 2924/12041; H01L 2224/8384; H01L 2224/83874
(Continued)

(56) References Cited

U.S. PATENT DOCUMENTS 4,208,005 A 6/1980 Nate et al.
4,615,093 A 10/1986 Tews et al.
(Continued)

FOREIGN PATENT DOCUMENTS

CN 1275307 11/2000
CN 1819761 8/2006
(Continued)

OTHER PUBLICATIONS

Electronic Specifier, Siplace X-Series: Maximum efficiency in LED placement; Apr. 8, 2010, retrieved on Oct. 27, 2017: https://www.electronicspecifier.com/pending/siplace-x-series-maximum-efficiency-in-led-placement—1 page.
(Continued)

*Primary Examiner* — Sheikh Maruf
(74) *Attorney, Agent, or Firm* — Dority & Manning, PA

(57) ABSTRACT

The invention concerns a process for the production of a circuit carrier (1) equipped with at least one surface-mount LED (SMD-LED), wherein the at least one SMD-LED (2) is positioned in oriented relationship to one or more reference points (3) of the circuit carrier (1) on the circuit carrier (1), wherein the position of a light-emitting region (4) of the at least one SMD-LED (2) is optically detected in the SMD-LED (2) and the at least one SMD-LED (2) is mounted to the circuit carrier (1) in dependence on the detected position of the light-emitting region (4) of the at least one SMD-LED (2), and such a circuit carrier (1).

10 Claims, 6 Drawing Sheets

Related U.S. Application Data continuation of application No. 14/836,049, filed on Aug. 26, 2015, now Pat. No. 10,217,675, which is a continuation of application No. PCT/AT2014/000027, filed on Feb. 7, 2014.

(51) Int. Cl.

| | | |
|---|---|---|
| *H05K 13/04* | (2006.01) | |
| *H05K 1/02* | (2006.01) | |
| *H05K 3/30* | (2006.01) | |
| *H05K 13/08* | (2006.01) | |
| *H01L 23/00* | (2006.01) | |
| *H05K 3/32* | (2006.01) | |
| *H05K 3/34* | (2006.01) | |
| *H01L 33/48* | (2010.01) | |
| *H01L 25/13* | (2006.01) | |
| *H01L 33/62* | (2010.01) | |

(52) U.S. Cl.
CPC ........... *H05K 3/303* (2013.01); *H05K 13/046* (2013.01); *H05K 13/0812* (2018.08); *H05K 13/0815* (2018.08); *H01L 24/27* (2013.01); *H01L 24/29* (2013.01); *H01L 24/32* (2013.01); *H01L 25/13* (2013.01); *H01L 33/486* (2013.01); *H01L 33/62* (2013.01); *H01L 2224/2732* (2013.01); *H01L 2224/293* (2013.01); *H01L 2224/29294* (2013.01); *H01L 2224/29339* (2013.01); *H01L 2224/32227* (2013.01); *H01L 2224/75745* (2013.01); *H01L 2224/831* (2013.01); *H01L 2224/8384* (2013.01); *H01L 2224/83101* (2013.01); *H01L 2224/83122* (2013.01); *H01L 2224/83192* (2013.01); *H01L 2224/83815* (2013.01); *H01L 2224/83862* (2013.01); *H01L 2224/83874* (2013.01); *H01L 2224/83885* (2013.01); *H01L 2224/83905* (2013.01); *H01L 2924/12041* (2013.01); *H05K 3/321* (2013.01); *H05K 3/341* (2013.01); *H05K 2201/10106* (2013.01); *H05K 2203/166* (2013.01); *Y02P 70/50* (2015.11)

(58) Field of Classification Search
USPC ........................................................... 438/4
See application file for complete search history.

(56) References Cited

U.S. PATENT DOCUMENTS

| | | | |
|---|---|---|---|
| 4,916,805 A | | 4/1990 | Ellrich et al. |
| 4,980,971 A | | 1/1991 | Bartschat et al. |
| 5,137,936 A | | 8/1992 | Akiguchi et al. |
| 5,173,759 A | | 12/1992 | Murano |
| 5,290,986 A | | 3/1994 | Colon |
| 5,559,727 A | | 9/1996 | Deley et al. |
| 5,758,942 A | | 6/1998 | Fogal et al. |
| 5,854,087 A | | 12/1998 | Kurata |
| 5,857,767 A | | 1/1999 | Hochstein |
| 5,893,511 A | | 4/1999 | Schwarzbauer |
| 5,917,200 A | | 6/1999 | Kurata |
| 5,943,586 A | | 8/1999 | Koizumi et al. |
| 6,023,104 A | | 2/2000 | Koizuma et al. |
| 6,040,895 A | | 3/2000 | Haas |
| 6,208,419 B1 | * | 3/2001 | Yamamoto ............ H01L 21/681 |
| | | | 356/400 |
| 6,266,891 B1 | | 7/2001 | Yamammoto |
| 6,285,782 B1 | | 9/2001 | Inoue et al. |
| 6,312,624 B1 | | 11/2001 | Kropp |
| 6,359,694 B1 | | 3/2002 | Stredele et al. |
| 6,369,884 B1 | | 4/2002 | Yamamoto |
| 6,480,223 B1 | | 11/2002 | Grasmueller |
| 6,486,467 B1 | * | 11/2002 | Speckbacher ...... G01D 5/34715 |
| | | | 250/231.16 |
| 6,542,238 B1 | | 4/2003 | Tsuboi et al. |
| 6,693,293 B2 | | 2/2004 | Oomori et al. |
| 6,956,879 B2 | | 10/2005 | Tatsuta |
| 7,084,353 B1 | | 8/2006 | Downes |
| 7,638,814 B2 | | 12/2009 | Wall, Jr. et al. |
| 7,660,336 B2 | | 2/2010 | Knotz |
| 8,015,696 B2 | | 9/2011 | Fukunaga |
| 8,860,045 B2 | * | 10/2014 | Lin ..................... H01L 25/0753 |
| | | | 257/88 |
| 2002/0187571 A1 | * | 12/2002 | Collins, III ............. H01L 33/50 |
| | | | 438/29 |
| 2002/0196639 A1 | | 12/2002 | Weidel |
| 2003/0159279 A1 | | 8/2003 | Bachthaler et al. |
| 2003/0206650 A1 | | 11/2003 | Gladnick |
| 2004/0033679 A1 | | 2/2004 | Jacobson |
| 2004/0076739 A1 | | 4/2004 | Yokono et al. |
| 2004/0105264 A1 | * | 6/2004 | Spero ...................... F21V 29/70 |
| | | | 362/276 |
| 2004/0179209 A1 | | 9/2004 | Besch |
| 2004/0239952 A1 | | 12/2004 | Mueller |
| 2005/0014311 A1 | | 1/2005 | Hayasaka |
| 2005/0093146 A1 | | 5/2005 | Sakano |
| 2005/0105301 A1 | | 5/2005 | Takeda et al. |
| 2006/0007148 A1 | * | 1/2006 | Theytaz ................. G06F 3/0317 |
| | | | 345/163 |
| 2006/0091293 A1 | * | 5/2006 | Grueger ................ H01L 31/173 |
| | | | 250/208.6 |
| 2006/0187982 A1 | | 8/2006 | Knotz |
| 2006/0209910 A1 | | 9/2006 | Fukunaga |
| 2006/0211240 A1 | | 9/2006 | Chi |
| 2006/0231952 A1 | | 10/2006 | Kim |
| 2006/0244117 A1 | | 11/2006 | Karnezos |
| 2007/0187818 A1 | | 8/2007 | Lyne |
| 2008/0023711 A1 | | 1/2008 | Tarsa |
| 2008/0137106 A1 | | 6/2008 | Ono |
| 2008/0156398 A1 | | 7/2008 | Yasuda et al. |
| 2008/0157113 A1 | | 7/2008 | Hayashi |
| 2008/0160183 A1 | | 7/2008 | Ide et al. |
| 2008/0183043 A1 | * | 7/2008 | Spinnler ................. H04N 5/2256 |
| | | | 600/178 |
| 2008/0186725 A1 | | 8/2008 | Schlager et al. |
| 2008/0284311 A1 | | 11/2008 | Schug |
| 2008/0315214 A1 | | 12/2008 | Wall, Jr. et al. |
| 2009/0021141 A1 | | 1/2009 | Emoto |
| 2009/0056111 A1 | | 3/2009 | Muren |
| 2009/0090002 A1 | | 4/2009 | Motomuro |
| 2009/0129085 A1 | * | 5/2009 | Aizar ...................... H01L 33/60 |
| | | | 362/247 |
| 2009/0189949 A1 | | 7/2009 | Wu |
| 2009/0251918 A1 | | 10/2009 | Engl et al. |
| 2009/0267085 A1 | * | 10/2009 | Lee ........................ H01L 33/20 |
| | | | 257/88 |
| 2009/0269704 A1 | | 10/2009 | Hodono |
| 2009/0272971 A1 | | 11/2009 | Lee |
| 2009/0291296 A1 | | 11/2009 | McConnelee |
| 2009/0321750 A1 | * | 12/2009 | Namioka ............... H05K 3/3442 |
| | | | 257/81 |
| 2010/0007896 A1 | | 1/2010 | Fishbaine |
| 2010/0023929 A1 | | 1/2010 | Jones et al. |
| 2010/0053929 A1 | | 3/2010 | Bisberg |
| 2010/0132187 A1 | | 6/2010 | Nishino et al. |
| 2010/0164367 A1 | | 7/2010 | Shioi |
| 2010/0214466 A1 | * | 8/2010 | Oliva .................... H01L 27/14625 |
| | | | 348/335 |
| 2010/0237767 A1 | | 9/2010 | Emoto |
| 2010/0246936 A1 | | 9/2010 | Ji et al. |
| 2010/0284198 A1 | | 11/2010 | Willwohl et al. |
| 2011/0032722 A1 | | 2/2011 | Ishida et al. |
| 2011/0049541 A1 | | 3/2011 | Katsuno |
| 2011/0248293 A1 | | 10/2011 | Chan |
| 2011/0285314 A1 | * | 11/2011 | Carney .................... F21V 23/06 |
| | | | 315/294 |
| 2011/0286207 A1 | * | 11/2011 | Chan ........................ F21S 4/20 |
| | | | 362/217.1 |
| 2011/0291152 A1 | | 12/2011 | Liaw |
| 2011/0309384 A1 | | 12/2011 | Ito et al. |

(56) References Cited

U.S. PATENT DOCUMENTS

| | | | |
|---|---|---|---|
| 2012/0063157 A1 | 3/2012 | Nakazato et al. | |
| 2012/0081618 A1 | 4/2012 | Matsui | |
| 2012/0202300 A1* | 8/2012 | Yu | H01L 24/743 438/5 |
| 2012/0206050 A1* | 8/2012 | Spero | F21S 41/143 315/152 |
| 2012/0217531 A1 | 8/2012 | Katsuno | |
| 2012/0230011 A1 | 9/2012 | Harada | |
| 2012/0249779 A1 | 10/2012 | Ji et al. | |
| 2012/0262567 A1 | 10/2012 | Tsuboi et al. | |
| 2012/0313207 A1 | 12/2012 | Oganesian | |
| 2012/0317802 A1 | 12/2012 | Yamamoto et al. | |
| 2013/0063918 A1 | 3/2013 | Haba | |
| 2013/0245988 A1 | 9/2013 | Lai | |
| 2013/0341656 A1 | 12/2013 | Chan | |
| 2014/0169014 A1 | 6/2014 | Jungwirth et al. | |
| 2015/0028367 A1 | 1/2015 | Frei | |
| 2015/0041974 A1 | 2/2015 | Kobayashi | |
| 2015/0069435 A1 | 3/2015 | Chen | |
| 2015/0228549 A1 | 8/2015 | Mattina | |
| 2015/0237309 A1 | 8/2015 | Heilmann | |
| 2015/0255419 A1 | 9/2015 | Nishimoto | |
| 2015/0311104 A1* | 10/2015 | Xu | H01L 21/681 438/15 |
| 2015/0371908 A1* | 12/2015 | Bencher | H01L 21/268 438/4 |
| 2016/0040857 A1 | 2/2016 | Inoue | |
| 2016/0081243 A1 | 3/2016 | Azuma | |
| 2016/0155693 A1 | 6/2016 | Smith | |
| 2016/0276195 A1* | 9/2016 | Huska | H01L 22/20 |
| 2016/0291233 A1 | 10/2016 | Trutna | |
| 2016/0380172 A1 | 12/2016 | Brandl | |
| 2017/0051884 A1 | 2/2017 | Raring | |
| 2018/0204749 A1* | 7/2018 | Huska | H01L 24/75 |

FOREIGN PATENT DOCUMENTS

| | | |
|---|---|---|
| CN | 1853320 | 10/2006 |
| CN | 201629347 | 11/2010 |
| CN | 103079392 | 5/2013 |
| DE | 34 45 625 | 6/1986 |
| DE | 38 27 151 | 7/1989 |
| DE | 197 11 138 | 9/1998 |
| DE | 101 28 476 | 1/2003 |
| DE | 101 62 270 | 7/2003 |
| DE | 10 2005 005 896 | 8/2006 |
| DE | 10 2009 028 499 | 2/2011 |
| DE | 10 2010 031 939 | 1/2012 |
| DE | 10 2011 109 226 | 2/2013 |
| EP | 0269337 | 6/1988 |
| EP | 0 622 837 | 11/1994 |
| EP | 0 781 660 | 7/1997 |
| EP | 0 829 192 | 3/1998 |
| EP | 1 003 212 A2 | 5/2000 |
| EP | 1 020 106 | 7/2000 |
| EP | 1 057 389 | 12/2000 |
| EP | 1 675 453 | 6/2006 |
| EP | 1 693 935 | 8/2006 |
| EP | 1 925 876 | 5/2008 |
| EP | 2 112 534 | 10/2009 |
| JP | S55100514 | 7/1980 |
| JP | S60-12786 | 1/1985 |
| JP | H01209578 | 8/1989 |
| JP | H05259627 | 10/1993 |
| JP | H0624040 | 2/1994 |
| JP | 6-349892 | 12/1994 |
| JP | H06349892 | 12/1994 |
| JP | 7-94786 | 4/1995 |
| JP | H0794786 | 4/1995 |
| JP | 2000022396 | 1/2000 |
| JP | 2000-150970 | 5/2000 |
| JP | 2000-164626 | 6/2000 |
| JP | 2000-183404 | 6/2000 |
| JP | 2000183404 | 6/2000 |
| JP | 2002-365019 | 12/2002 |
| JP | 2002365019 | 12/2002 |
| JP | 2003-110245 | 4/2003 |
| JP | 2003298294 | 10/2003 |
| JP | 2004079750 | 3/2004 |
| JP | 2004-207655 | 7/2004 |
| JP | 2004-325146 | 11/2004 |
| JP | 2005-026619 | 1/2005 |
| JP | 2005-64303 | 3/2005 |
| JP | 2006093359 | 4/2006 |
| JP | 2006-138679 | 6/2006 |
| JP | 2006173197 | 6/2006 |
| JP | 2006-229224 | 8/2006 |
| JP | 3844009 | 8/2006 |
| JP | 2006-310653 | 11/2006 |
| JP | 2007087608 | 4/2007 |
| JP | 2009083127 | 4/2009 |
| JP | 4357168 | 8/2009 |
| JP | 2010-044967 | 2/2010 |
| JP | 2012-178507 | 9/2012 |
| JP | 2012-238410 | 12/2012 |
| JP | 2012-238411 | 12/2012 |
| JP | 2012-248708 | 12/2012 |
| JP | 2012238410 | 12/2012 |
| KR | 10-2010-0108969 | 10/2010 |
| KR | 10-2011-0060868 | 6/2011 |
| KR | 10-2013-0006895 | 1/2013 |
| KR | 10-2013-0006970 | 1/2013 |
| TW | M324300 | 12/2007 |
| TW | 201222899 | 6/2012 |
| TW | 201230268 | 7/2012 |
| WO | WO99/20093 | 4/1999 |
| WO | WO 2007/130912 | 11/2007 |
| WO | WO 2008/155700 | 12/2008 |
| WO | WO 2009/021694 | 2/2009 |
| WO | WO 2009/031903 | 3/2009 |
| WO | WO 2009/037634 | 3/2009 |
| WO | WO2010/146902 | 12/2010 |
| WO | WO2011/003948 | 1/2011 |
| WO | WO 2011/141377 | 11/2011 |
| WO | WO 2012/057038 | 5/2012 |
| WO | WO 2012/128094 | 9/2012 |
| WO | WO13/020155 | 2/2013 |
| WO | WO 2013/120120 | 8/2013 |
| WO | WO 2015/067353 | 5/2015 |

OTHER PUBLICATIONS

Mirtec Press Release, Sep. 11, 2015, retrieved on Oct. 24. 2017, http://mirteceurope.com/press_release.php?id=74—3 pages.

Mirtec PowerPoint Presentation: http://cherbsloeh.pl/gfx/docs/gitem_7819/prezentacja-mirtec.pdf—71 pages.

Kurdthongmee et al., "An Automatic System for Non-Uniform Brightness Compensation of LED Arrays: Image Processing Routines to Locate LED Centers," Walailak J Sci & Tech 2008; 5(2), pp. 203-216.

Strauss, *SMT Soldering Handbook*, Butterworth-Heinemann, Oxford, Second edition 1998, [excerpt] Wavesoldering 4.8, pp. 141-143, 7 pages.

Notice of Examination—Communication dated Aug. 17, 2017 in Taiwanese Application No. 103105400, with attached concise explanation of relevance—4 pages.

"Prozess und Systemlosungen fur die SMT—Montage optischer Bauelemente aur Substrate mit integrierten Lichwellealeitern," Daniel Craiovan, Dec. 2011, with English language abstract—99 pages.

International Search Report (ISR) dated May 12, 2014 in International (PCT) Application No. PCT/AT2014/000027—1 page.

Austrian Patent Office Search Report (ASR) dated May 12, 2013 in Austrian Patent Application No. A 155/2013—1 page.

Siemens publication, "Retrofitting instructions PCB Camera Multicolor", HS-50/HSC-60, 2004 Edition—42 pages.

Chinese Search Report dated Aug. 15, 2016 in corresponding Chinese Application No. 201480001918.6—2 pages.

Chinese Search Report dated Dec. 30, 2015 in corresponding Chinese Application No. 201480001918.6—2 pages.

(56) References Cited

OTHER PUBLICATIONS

Kayaba, Masao, "Printed Board Lesson VI: Mounting Guide 2," Japan Electronic Circuit Industry Association, Tokyo, May 31, 2006 (with English translation)—7 pages.
Siplace SMT—Insights Vision Technology, ASM Assembly Systems, 2011—12 pages.
Cyril Buttay et al., Die Attach of Power Devices Using Silver Sintering—Bonding Process Optimization and Characterization, IMAPS, High Temperature Electronics Network (HiTEN), Jul. 2011, pp. 1-7.
Extract from Wikipedia—Laser Diode—12 pages.
A Practical Guide to Machine Vision Lighting, Daryl Martin, Midwest Sales and Support Manager, Advanced Illumination, Feb. 2012—21 pages.
Auszug aus Wikipedia—Leuchtdiode (German language Wikipedia webpage concerning the topic "Leuchtdiode" [English: Light-emitting diode]) Dec. 12, 2018—10 pgs.
Auszug aus Wikipedia—Selective Yellow (German language Wikipedia webpage concerning the topic "Selective Yellow") May 29, 2018—4 pgs.
Auszug aus Wikipedia—Laserdiode (German language Wikipedia webpage concerning the topic "Laserdiode" [English: Laser diode]) Oct. 17, 2018—5 pgs.
Oslon Black Flat Datasheet Version 1.11 (data sheet of an SMD-LED) published by Osram Opto Semiconductors GmbH, Nov. 19, 2018—22 pgs.
Oslon Compact CL Datasheet Version 1.2 (data sheet of an SMD-LED) published by Osram Opto Semiconductors GmbH, Oct. 12, 2015—22 pgs.

\* cited by examiner

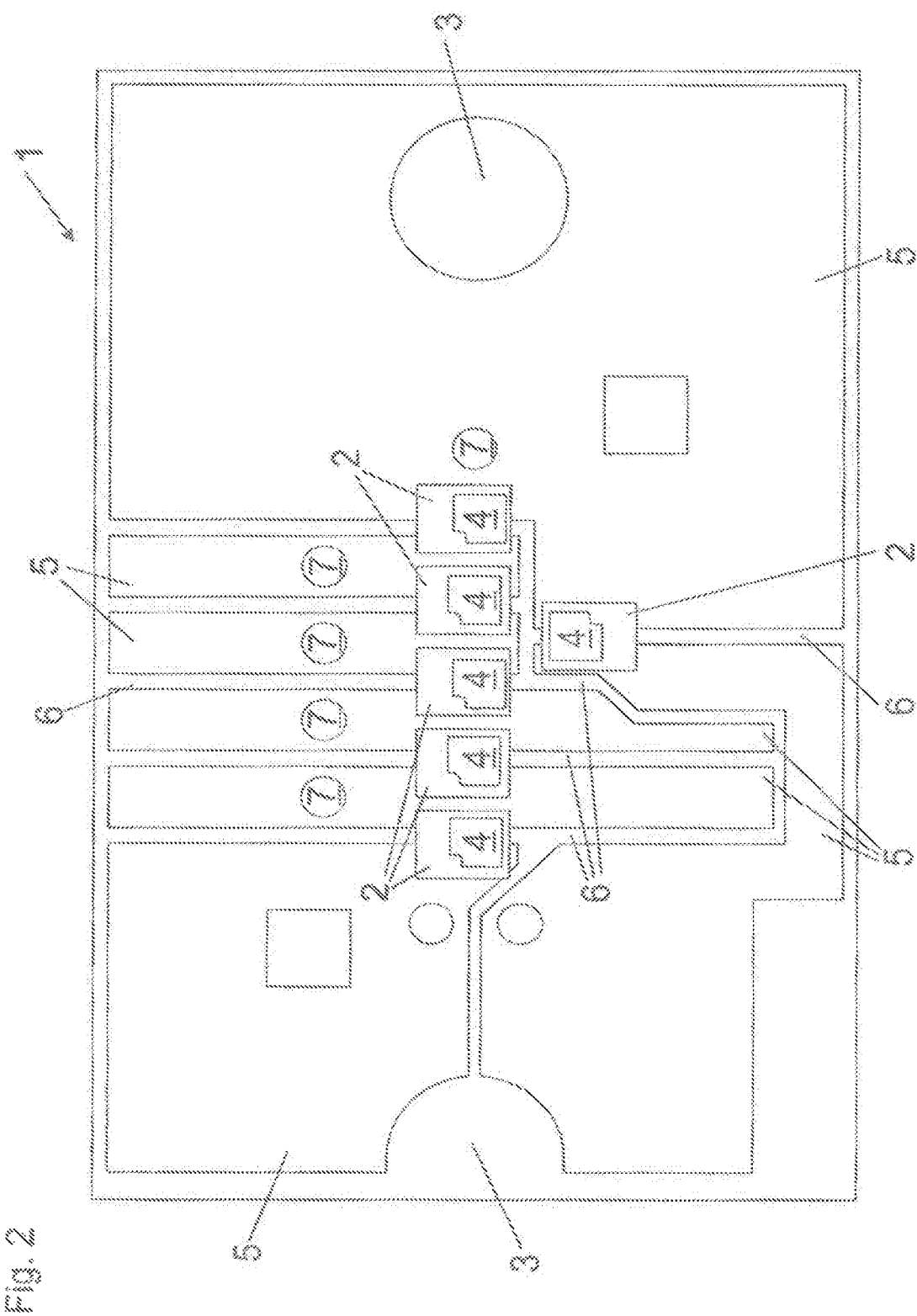

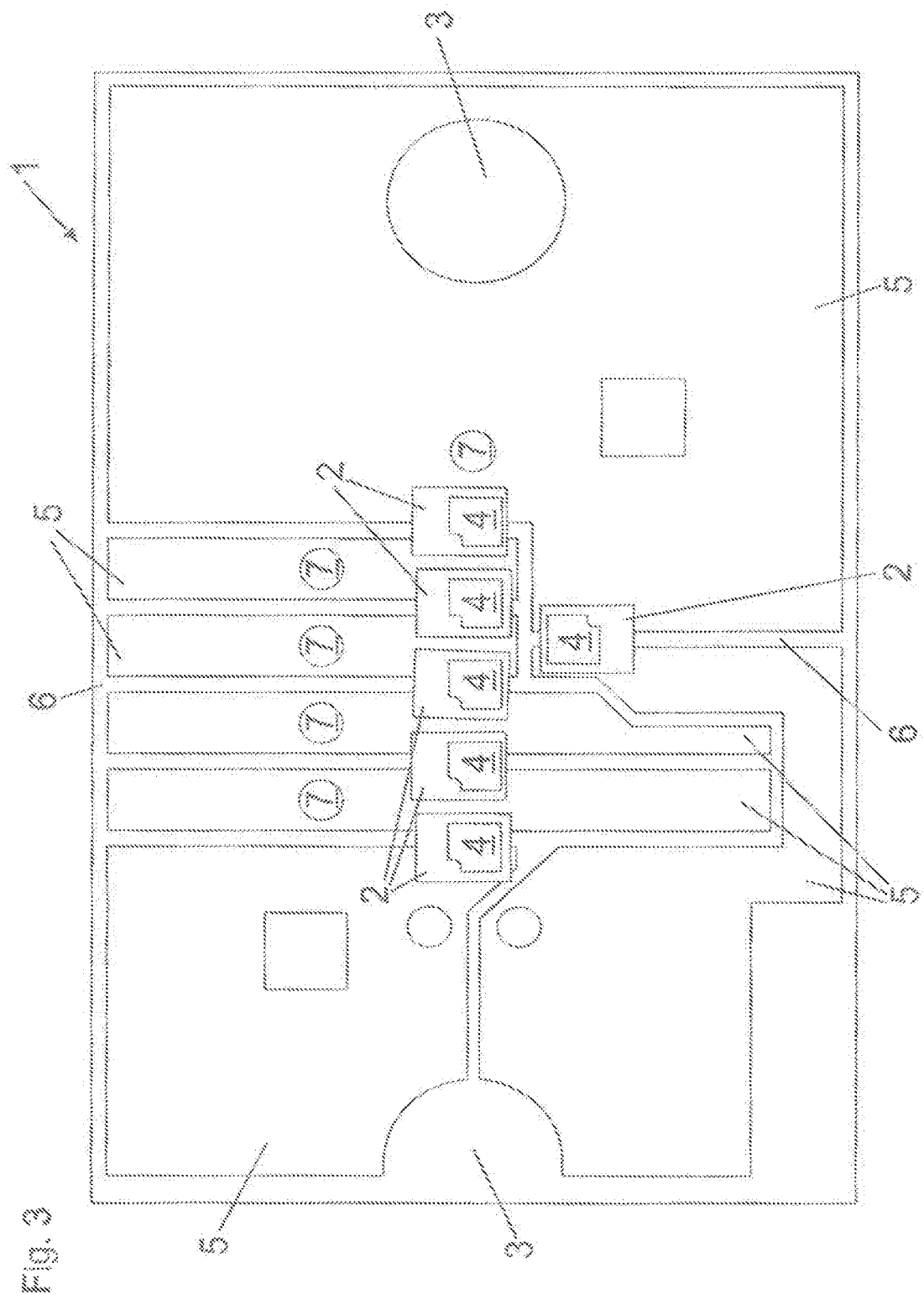

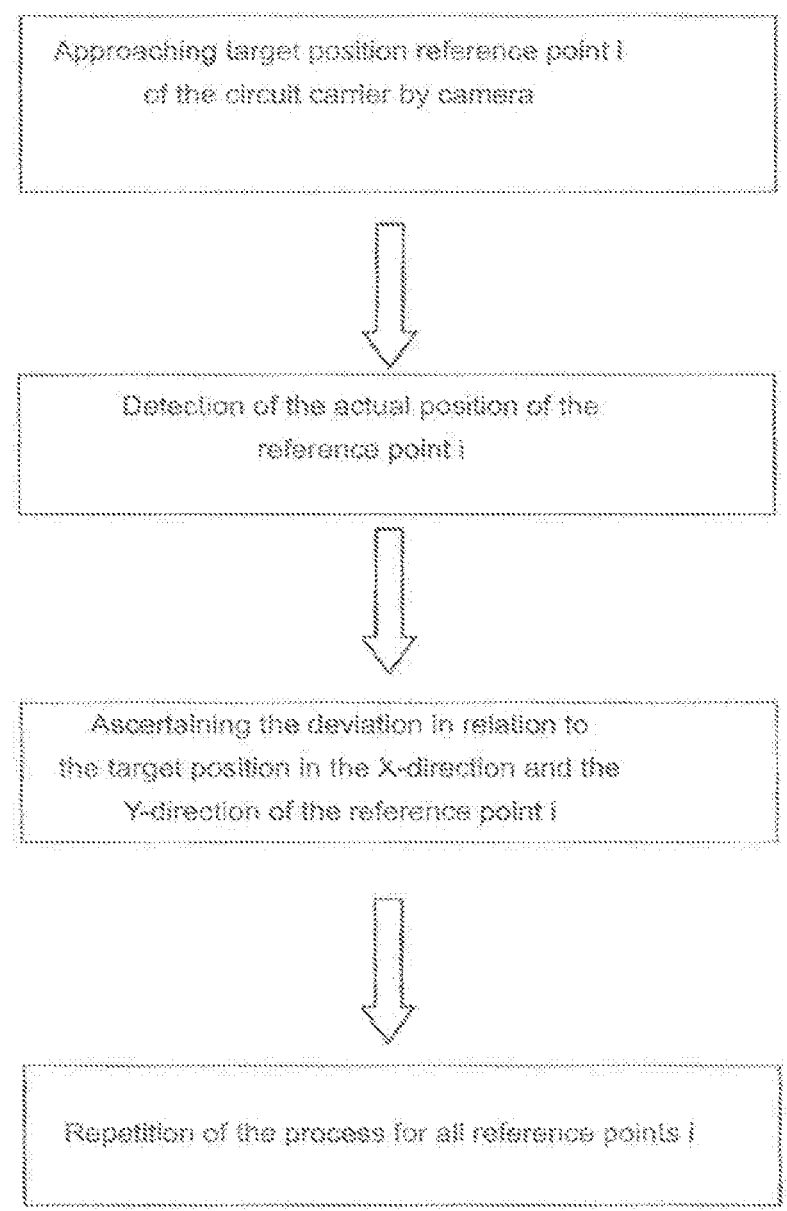

US 10,991,632 B2

ASSEMBLY PROCESS FOR CIRCUIT CARRIER AND CIRCUIT CARRIER

PRIORITY CLAIM

The present application is a continuation of U.S. application Ser. No. 16/262,260 filed on Jan. 30, 2019, which is a continuation of U.S. application Ser. No. 14/836,049, filed on Aug. 26, 2015 (now U.S. Pat. No. 10,217,675, issued on Feb. 26, 2019), which is a continuation 371 of International Application No. PCT/AT2014/000027, filed on Feb. 7, 2014, which claims benefit of priority to Austria Application No. A 155/2013, filed on Feb. 28, 2013. Applicant claims priority to and the benefit of each of such applications and incorporate all such applications herein by reference in its entirety.

BACKGROUND

The present invention concerns a process for the production of a circuit carrier fitted with at least one surface-mount LED (SMD-LED), having the features described below, and a circuit carrier having the features described below.

To implement light-optical applications based on surface-mount LED components (SMD-LED), highly precise mounting of the SMD-LED components on a circuit carrier is required. Examples are front headlights, daytime running lights, flashing indicators, active bending lights on motor vehicles, the light sources of which are LEDs.

In that respect the SMD-LEDs are to be mounted in position in relation to one or more defined reference points on the circuit carrier, then an optical system (for example attachment lenses) can be oriented in relation to those reference points.

Hitherto SMD-LED components have been placed on the circuit carriers using the so-called "Pick & Place" process and then soldered in the "Reflow" process. In that case the final position of the light-emitting region of the LED is determined by the following factors:
- the tolerances in the LED component (for example the position of the light-emitting region relative to the outside contour of the LED or relative to the position of the LED terminal pad),
- the tolerances in the circuit carrier which determine the position of the soldering pad (for example position of the conductor track relative to the contour of the circuit carrier and/or a through hole, position of the solder mask relative to a conductor track position), and
- the movement of the SMD-LED in the Reflow soldering process, caused by "slumping" of the solder paste in the pre-heating zone and the wetting forces of the solder upon melting in the peak zone (floating lift).

The final levels of positioning accuracy which can be achieved with that process in respect of the light-emitting region of SMD-LED components are already more than +/−110 μm solely when considering the tolerances of the SMD-LED and the circuit carrier (still without taking account of the action of the Reflow soldering process).

The effects of the Reflow soldering process produce additional positioning inaccuracies, in particular in the area of angular and tilting positional truth in respect of the SMD-LED components.

Mounting of the SMD-LED by means of current silver sintering processes is out of the question as those processes are linked to unacceptably long processing times of more than 10 seconds.

SUMMARY

The object of the invention is to provide a process of the general kind set forth, in which the inevitably present tolerances in the SMD-LEDs and the circuit carriers can be compensated, in particular a higher degree of accuracy in positioning and mounting of SMD-LEDs on circuit carriers can be achieved and the provision of a correspondingly equipped circuit carrier.

That object is attained by a process having the features described below and a circuit carrier having the features described below.

By mounting the at least one SMD-LED to the circuit carrier in dependence on the position of the light-emitting region in the SMD-LED it is possible to eliminate those accuracies which are due to tolerances in the LED component and in the circuit carrier. In that way it is possible to achieve tolerances of below +/−100 μm in positioning of the SMD-LED on the circuit carrier. The applicant's tests have shown that it is even possible to achieve tolerances of less than or equal to +/−50 μm.

In other words it is possible with the process according to the invention to substantially or even completely eliminate the component-inherent tolerances of the SMD-LED and the circuit carrier. In other words the tolerances which can be achieved with the process according to the invention are substantially now only limited by the precision of the detection process used for the light-emitting region of the SMD-LED. Depending on the project demands it is accordingly possible to select a sufficiently precise detection process, independently of the structure of the SMD-LED and the circuit carrier, and thereby achieve implementation of the tolerances prescribed in the project. In other words the greater tolerances of cheaper or simpler components can be compensated by the use of a more precise detection process. A more precise detection process can be achieved by using a more accurate optical camera and/or using a more accurate "Pick & Place" apparatus.

Detection of the light-emitting region of the at least one SMD-LED can be effected for example by the use of an optical camera which detects the characteristic contour of the light-emitting region.

Advantageous embodiments of the invention are described below.

The invention can be used for example in relation to circuit carriers which are employed for front headlights, daytime running lights, flashing indicators, adaptive bending lights on motor vehicles, the light sources of which are LEDs.

The reference point or points can be for example in the form of holes (round holes or elongate holes). Additionally or alternatively it is possible to use etched or printed structures.

For example it can be provided that mounting of the SMD-LED to the circuit carrier is effected in dependence on the position of the centre point of the light-emitting region of the SMD-LED. That is particularly advantageous for the reason that the orientation of an optical system which is usually arranged in the beam path of the SMD-LED is effected in relation to the centre point of the light-emitting region of the SM D-LED.

It is particularly preferably provided that at least one of the reference points is used for positioning and—preferably for fixing—an optical system for the at least one SMD-LED. In the state of the art the circuit carrier equipped with the SMD-LEDs must be oriented relative to the optical system in a dedicated process step in the mounting procedure. That can be dispensed with in the preferred embodiment described, as the use of at least one of the reference points for positioning of the optical system means that the system is already correctly oriented. If the at least one reference point is used not only for positioning the optical system but also for fixing the optical system to the circuit carrier (in this case the at least one reference point is for example in the form of a mounting hole for the optical system), that affords the highest level of accuracy. In many applications it may be acceptable to provide separate fixing locations for the optical system, which are oriented in relation to the at least one reference point.

To be able to orient the at least one SMD-LED in relation to the reference point or points of the circuit carrier at a later time, it is necessary to detect the position of the reference points of the circuit carrier. That can be effected for example in such a way that an optical camera passes over existing reference points and ascertains the respective deviation relative to the target position which arises out of the tolerance inherent in the component. Preferably the position of those reference points which are also later used for position an optical system for the SMD-LED is used.

Usually SMD-LEDs are provided in a feed belt from which they are removed from pockets arranged in the feed belt by means of a "Pick & Place" system corresponding to the state of the art, for example by means of a sucker (vacuum pipette). In the state of the art the contours of the SMD-LED or the position of the terminal pads is detected from the underside after removal from the feed belt. That is not possible in the case of the invention as here the position of the light-emitting region which is at the top side of the SMD-LED is crucial. When using a vacuum pipette system therefore detection of the light-emitting region must be effected prior to contacting by the sucker. In the case of SMD-LEDs which are provided in another fashion that requirement does not necessarily have to arise.

When using a vacuum pipette system the invention can be carried out as follows:

The position of the light-emitting region of the SMD-LED to be taken from the belt is detected by means of a camera which is so positioned or which is moveable into such a position that it can look into the individual pockets of the feed belt. Preferably the detected position is compared to a target position of the SMD-LED in the pocket, in which the SMD-LED would be arranged centrally in the pocket in oriented relationship with the direction of movement of the feed belt (Y-direction, X-direction=direction at a right angle to the Y-direction in the plane of the feed belt). Deviations in respect of the detected position of the light-emitting region relative to the target position in relation to the X- and Y-direction of the centre point of the light-emitting region and the angular position of the light-emitting region are calculated. In other words the random position of the SMD-LED in the pocket of the feed belt is ascertained and compared to the target position.

Detection of the position of the light-emitting region can become more robust by the SMD-LED being illuminated with a light source having a wavelength adapted to the LED spectrum. It is possible in that way to increase the contrast between the light-emitting region and the remaining region of the SMD-LED. The adapted wavelength can be for example in a range of 400 to 500 nm, preferably in a range of 420 to 490 nm.

That random position is no longer to be altered upon removal from the pocket by the vacuum pipette. To ensure that it may be advantageous to also ascertain the Z-position (Z-direction=at a right angle to the X- and Y-direction) of the light-emitting region or the SMD-LED as then contacting by the vacuum pipette can be effected gently in such a way that no change in position of the SMD-LED in the pocket occurs upon contacting.

As the position of the circuit carrier is known by ascertaining the position of the reference points it is possible, by means of the ascertained deviation of the light-emitting region of the SMD-LED, for the vacuum pipette to be actuated in such a way that it corrects the existing deviation in the X- and Y-direction and also by a rotation about an axis at a right angle to the SMD-LED and thus orients the SMD-LED in relation to the light-emitting region in the correct position. Tilting of the SMD-LED does not have to be taken in consideration as fixing to the vacuum pipette means that it cannot involve any angle relative to the axis of the vacuum pipette.

Described hereinafter are two alternative processes with which SMD-LEDs oriented in the correct position can be mounted to the circuit carrier in the correct position.

In the first process for mounting the at least one SMD-LED to the circuit carrier, silver sintering material is arranged at the at least one SMD-LED after orientation thereof has been effected and at least one SMD-LED is silver-sintered.

Preferably the circuit carrier to be equipped and/or the SMD-LED is raised to a temperature at which, upon and by pressing of the SMD-LED which is provided with sintering material, the sintering material is sintered.

To permit a sufficiently short process time the particle size of the silver sintering material should be less than about 100 nm, preferably less than about 60 nm. In that way, sintering is achieved within a contact time of less than 1 to 5 seconds after beginning the pressing procedure. For example a sintering material of a particle size in a range of about 20 nm to about 40 nm can be used. Silver sintering material of the desired particle size can be acquired from various suppliers.

Arranging the silver sintering material on the SMD-LED can be effected for example by applying a paste of silver sintering material and a suitable organic separating agent to the SMD-LED.

The paste can be applied for example without changing the position of the SMD-LED relative to the vacuum pipette by immersing the terminal pad in a prepared supplied deposit of paste.

Alternatively the silver sintering material can be applied to the SMD-LED by a "Die Transfer Film" (DTF) process. In that case the silver sintering material is in film form. Films of that kind can be commercially acquired.

No subsequent change in the correctly positioned orientation of the SMD-LED can occur due to the sintering operation as the SMD-LED can be held fast by the vacuum pipette until the sintering operation is concluded. Tilting of the SMD-LED cannot occur as it is pressed against the surface of the circuit carrier by the vacuum pipette.

The second process for mounting the at least one SMD-LED to the circuit carrier is based on a Reflow soldering process.

In that case the solder paste is applied to the circuit carrier—preferably by being printed thereon. Then an adhesive is applied to the circuit carrier—preferably in dependence on the detected position of the light-emitting region of the at least one SMD-LED. The SMD-LED is placed on the circuit carrier. The adhesive is then at least partially hardened. Reflow soldering of the solder paste can then be effected.

The use of the adhesive makes it possible to avoid the SMD-LED floating in the Reflow soldering operation.

Particularly preferably the adhesive used is a UV-hardenable adhesive. In that case at least partial hardening of the adhesive can be effected by exposure to UV light. Quite particularly preferably a hybrid adhesive is used, which is UV- and temperature-hardenable. That can subsequently harden in the soldering operation in the furnace.

Either individual illumination of each individual SMD-LED can be effected, but preferably simultaneous illumination of all SMD-LEDs is effected to reduce the cycle time.

Further advantages and details of the invention will be apparent from the Figures and the related specific description. The same references are used for identical components in all Figures.

BRIEF DESCRIPTION OF THE DRAWINGS

FIG. 2 shows a test layout which serves to check the positional accuracy of each individual SMD-LED.

FIG. 3 shows a test layout which serves to check the positional accuracy of each individual SMD-LED.

FIG. 4a shows a process according to the invention.

DETAILED DESCRIPTION

Figure 1:
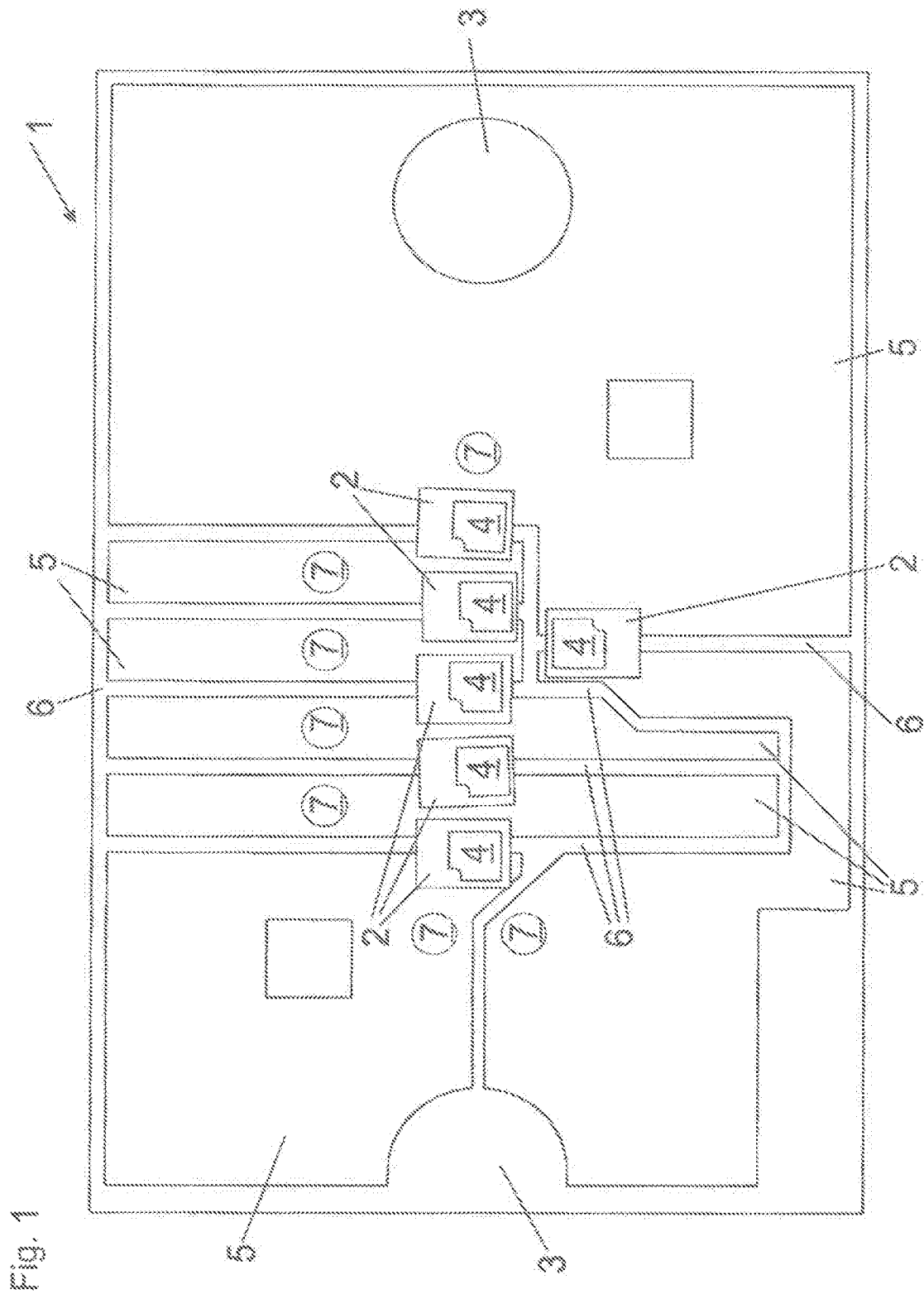
FIG. 1 shows a test layout which serves to check the positional accuracy of each individual SMD-LED.

FIGS. 1 to 3 show test layouts which serve to check the positional accuracy of each individual SMD-LED 2. The circuit carrier 1 has electrically conductive surfaces 5 which are insulated from each other by insulating regions 6. The conductive surfaces 5 can be supplied with electric power by way of terminals 7. FIG. 1 shows a circuit carrier 1 equipped with six SMD-LEDs 2. It is possible to see two reference points 3 which on the one hand serve to ascertain the deviation of the target positions for the SMD-LEDs 2 on the circuit carrier 1 and which on the other hand can also be used for fixing an optical system (not shown) for the SMD-LEDs 2. The optical system is oriented by way of separate reference points which are not shown in this Figure.

In FIG. 1 the mounting operation was effected with a "Pick & Place" and Reflow soldering process in accordance with the state of the art. In themselves the SMD-LEDs 2 are oriented by means of their outside contours relative to the reference points 3. The Reflow soldering process involves blurring of the position of the SMD-LEDs 2 so that the situation no longer involves an ordered orientation of the outside contours of the SMD-LEDs 2. Orientation in relation to the light-emitting regions 4 of the SMD-LEDs 2 has not occurred at all.

FIG. 2 shows a circuit carrier 1 equipped with six SMD-LEDs 2, the difference in relation to FIG. 1 being that the SMD-LEDs 2 are mounted on the circuit carrier 1 in the correct position in relation to the outside contour, but no mounting is effected in dependence on the light-emitting regions 4 of the SMD-LEDs 2. This circuit carrier 1 also does not meet the requirements in regard to positioning accuracy of the light-emitting regions 4.

FIG. 3 in contrast shows an embodiment by way of example of the invention in which the SMD-LEDs 2 are mounted in the correct position relative to the reference points 3 of the circuit carrier 1, on the circuit carrier 1, in regard to their light-emitting regions 4. This circuit carrier 1 meets the requirements in regard to positioning accuracy of the light-emitting regions 4.

Figure 4B:
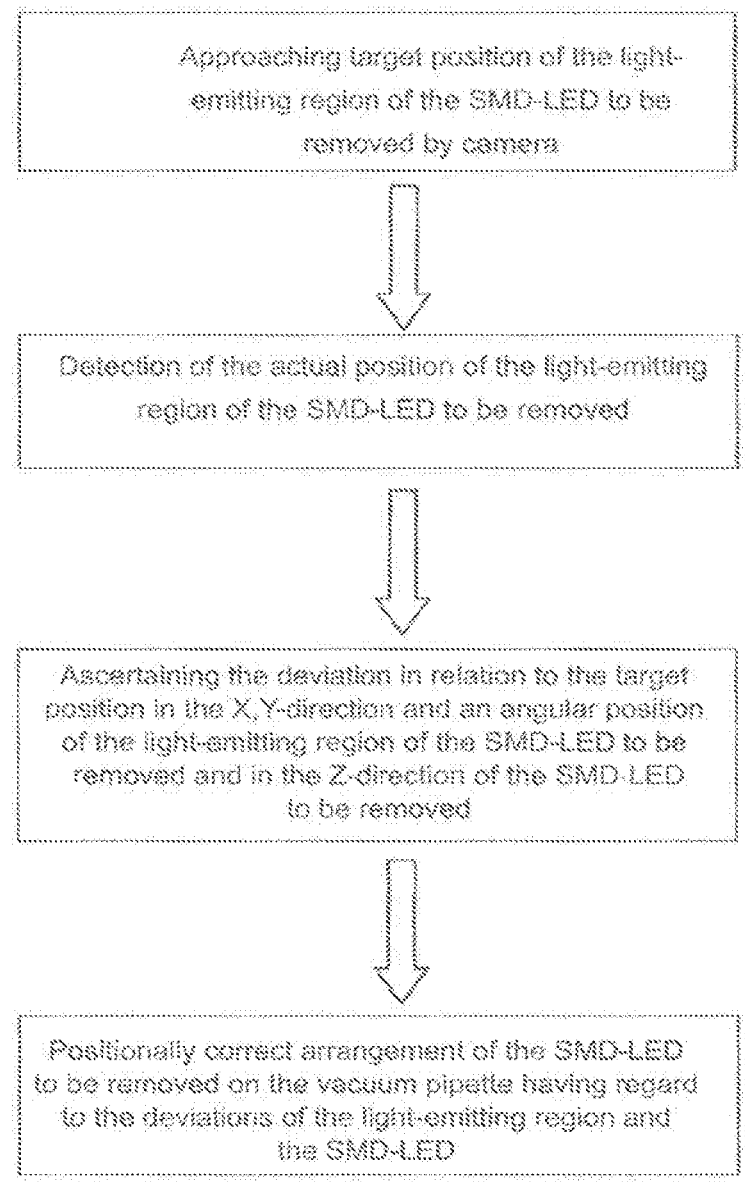
FIG. 4b shows a process according to the invention.
Figure 4C:
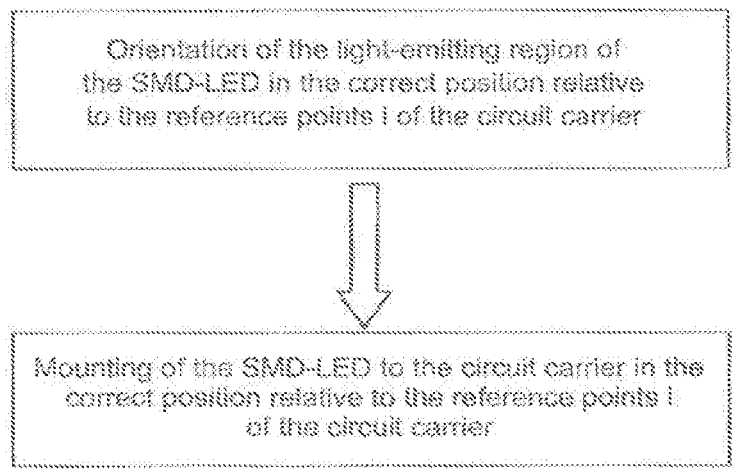
FIG. 4c shows a process according to the invention.

FIGS. 4a, 4b and 4c show a process according to the invention including the steps:

ascertaining the deviation in relation to the target position in the X-direction and the Y-direction of the reference point 3 i for all reference points 3 i (FIG. 4a), ascertaining the deviation in relation to the target position in the X,Y-direction and an angular position of the light-emitting region 4 of the SMD-LED 2 to be removed and in the Z-direction of the SMD-LED 2 to be removed (FIG. 4b), and mounting of the SMD-LED 2 to the circuit carrier 1 in the correct position relative to the reference points 3 i of the circuit carrier 1 (FIG. 4c).

The invention claimed is:

1. A process for the production of a circuit carrier having at least one light emitting diode, the circuit carrier for use in a motor vehicle, the process comprising:
    illuminating a light emitting region of a light emitting diode with light from a light source that is separated from the light emitting diode, the light having a wavelength in a range of 400 nm to 500 nm;
    detecting a position of the light emitting region of the light emitting diode while illuminating the light emitting region of the light diode with the light from the light source that is separated from the light emitting diode;
    positioning the light emitting diode in relationship to one or more reference points of the circuit carrier based at least in part on the position of the light emitting region.

2. The process of claim 1, wherein the process further comprises mounting the light emitting diode to the circuit carrier.

3. The process of claim 1, wherein detecting a position of the light emitting region comprises detecting a contour of the light emitting region using an optical camera.

4. The process of claim 1, wherein the one or more reference points comprise a hole in the circuit carrier.

5. The process of claim 4, wherein the one or more references points comprise a mounting hole.

6. The process of claim 1, wherein the light has a wavelength in a range of 420 nm to 490 nm.

7. The process of claim 1, wherein detecting a position of the light emitting region of the light emitting diode comprises detecting the position in three-dimensions.

8. The process of claim 1, wherein detecting a position of the light emitting region of the light emitting diode comprises determining an angular position relative to an axis of rotation at a right angle to a plane of light emitting diode.

9. The process of claim 2, wherein mounting the light emitting diode to the circuit carrier comprises:
    applying solder paste to the circuit carrier;
    applying an adhesive to the circuit carrier;
    partially hardening the adhesive;
    reflow soldering the solder paste.

10. A circuit carrier for use in a motor vehicle, the circuit carrier manufactured according to the process of claim 1.

* * * * *